(12) United States Patent
Fukasawa et al.

(10) Patent No.: US 8,460,491 B1
(45) Date of Patent: Jun. 11, 2013

(54) DIE BONDER AND BONDING METHOD

(75) Inventors: Shingo Fukasawa, Kumagaya (JP);
Tatsuyuki Okubo, Kumagaya (JP);
Yoshihiro Kurihara, Kumagaya (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 0 days.

(21) Appl. No.: 13/414,236

(22) Filed: Mar. 7, 2012

(30) Foreign Application Priority Data

Jan. 31, 2012 (JP) ................................. 2012-018365

(51) Int. Cl.
*B32B 41/00* (2006.01)

(52) U.S. Cl.
USPC ............. 156/64; 156/230; 156/344; 156/350; 156/367; 156/378; 156/379; 156/540; 156/584

(58) Field of Classification Search
USPC .................. 156/64, 230, 344, 350, 367, 378, 156/379, 540, 584
See application file for complete search history.

(56) References Cited

U.S. PATENT DOCUMENTS

2004/0121513 A1* 6/2004 Taguchi et al. ............... 438/106
2010/0047053 A1* 2/2010 Burke et al. .................. 414/787

FOREIGN PATENT DOCUMENTS

JP 2004-200379 A 7/2004
JP 2010123825 A * 6/2010

* cited by examiner

*Primary Examiner* — Katarzyna Wyrozebski Lee
*Assistant Examiner* — Joshel Rivera
(74) *Attorney, Agent, or Firm* — Crowell & Moring LLP (57) ABSTRACT

The present invention provides die bonder and bonding method by which a bonding load from a high load to a low load is obtained or high-speed mounting is attained.
In a die bonder or a bonding method in which a bonding head is ascended/descended by a first ascending/descending drive shaft unit, a die is picked up, the picked-up die is installed onto a workpiece, and after installed, a load is exerted on the die by the bonding head to bond the die to the workpiece, whether the load is higher/lower than a predetermined load is determined, and in bonding, when the load is higher than the predetermined load, the high load is exerted by the first ascending/descending drive shaft unit, and when the load is lower than the predetermined load, the low load is exerted by a second ascending/descending drive shaft unit.

11 Claims, 5 Drawing Sheets

DIE BONDER AND BONDING METHOD

BACKGROUND OF THE INVENTION

The present invention relates to a die bonder and a bonding method, and more particularly to highly reliable die bonder and bonding method that attain sure bonding of a semiconductor chip (a die) onto a workpiece.

As one of semiconductor manufacturing devices, a die bonder that bonds a die to a workpiece such as a lead frame, a substrate or the like is available. In the die bonder, a bonding head adsorbs in vacuum a die which has been divided into pieces on a wafer, and ascends at a high speed, horizontally moves and descends the die, and bonds it onto the workpiece.

The die is bonded to the workpiece with an adhesive applied onto the workpiece or an adhesive tape affixed to a rear surface of the die. For sure bonding, it is desirable to obtain a predetermined adhesive strength by exerting an arbitrary load on a surface of the die by a bonding head.

As an example of related art configured to obtain a predetermined adhesive strength as mentioned above, there is Japanese Patent Application Laid-Open No. 2004-200379. Japanese Patent Application Laid-Open No. 2004-200379 discloses such a technique that a depressing member is disposed independently of a bonding head, its surface on which a load cell is disposed is pressed against the bonding head to gradually reduce a descending speed of the bonding head.

SUMMARY OF THE INVENTION

However, in the technique disclosed in Japanese Patent Application Laid-Open No. 2004-200379, although a high load which is within a load range of several tens (for example, 30) N (newton) may be exerted, it is difficult to exert a load which is lower than one digit (for example, 8) N. In addition, in servo motor driving in which ball screws are used to drive the bonding head and the depressing member, speeding-up is limited.

Therefore, a first object of the present invention is to provide die bonder and bonding method by which a load desirable for bonding ranging from a high load to a low load is obtained.

A second object of the present invention is to provide die bonder and bonding method by which high-speed bonding of a die is attained.

According to one embodiment of the present invention, a die bonder includes a die bonding head for picking up a die and bonding the die onto a workpiece, a biaxial drive shaft unit which includes an ascending/descending drive shaft unit for ascending/descending the bonding head and a horizontal-direction drive shaft unit for moving the ascending/descending drive shaft unit in a horizontal direction perpendicular to a direction in which the bonding head is ascended/descended and a control unit for controlling the biaxial drive shaft unit, wherein the ascending/descending drive shaft unit includes a first ascending/descending drive shaft unit for ascending/descending the bonding head and being able to exert a high bonding load which is higher than a predetermined load on the die via the bonding head, and a second ascending/descending drive shaft unit which is installed on the side of a leading end of the first ascending/descending drive shaft unit, ascends/descends in the direction in which the bonding head is ascended/descended and able to exert a low bonding load which is lower than the predetermined load on the die via the bonding head.

According to another embodiment of the present invention, a bonding method includes the picking-up step of ascending/descending a bonding head by a first ascending/descending drive shaft unit and picking up a die, the installing step of descending the bonding head to install the picked-up die on a workpiece and the bonding step of bonding the die to the workpiece by exerting a load on the die by the bonding head after installed, and further includes the determining step of determining whether the load is higher/lower than a predetermined load, wherein the bonding step includes the high load exerting step of, when the load is a high load which is higher than the predetermined load, exerting the high load by the first ascending/descending drive shaft unit, and the low load exerting step of, when the load is a low load which is lower than the predetermined load, exerting the low load by a second ascending/descending drive shaft unit which is serially installed under the first ascending/descending drive shaft unit and ascends/descends the bonding head.

According to a further embodiment of the present invention, the first ascending/descending drive shaft unit and the second ascending/descending drive shaft unit are configured using linear motors.

According to a still further embodiment of the present invention, the linear motor of the first ascending/descending drive shaft unit is a magnet type linear motor, and the linear motor of the second ascending/descending drive shaft unit is a voice coil motor.

According to a still further embodiment of the present invention, the control unit torque-controls the linear motor of the first ascending/descending drive shaft unit when the bonding load is to be exerted and position-controls the linear motor of the first ascending/descending drive shaft unit in other cases.

According to a still further embodiment of the present invention, a load detection sensor for detecting the high bonding load is disposed on the first ascending/descending drive shaft unit with which a head of the bonding head is brought into contact.

According to a still further embodiment of the present invention, the picking-up step controls loads to be exerted when picking up the die and when bonding the die by the second ascending/descending drive shaft unit.

According to a still further embodiment of the present invention, the high load exerting step reduces the load on the second ascending/descending drive shaft unit to zero or to almost zero to switch control of the first ascending/descending drive shaft unit from position control to torque control.

According to a still further embodiment of the present invention, the low load exerting step position-controls the first ascending/descending drive shaft unit while the load is being exerted.

The present invention allows provision of die bonder and bonding method by which a load desirable for bonding ranging from a high load to a low load is obtained.

The present invention also allows provision of die bonder and bonding method by which high-speed mounting of a die is attained.

DESCRIPTION OF THE PREFERRED EMBODIMENTS

Hereinafter, embodiments of the present invention will be described with reference to the accompanying drawings.

Figure 1:
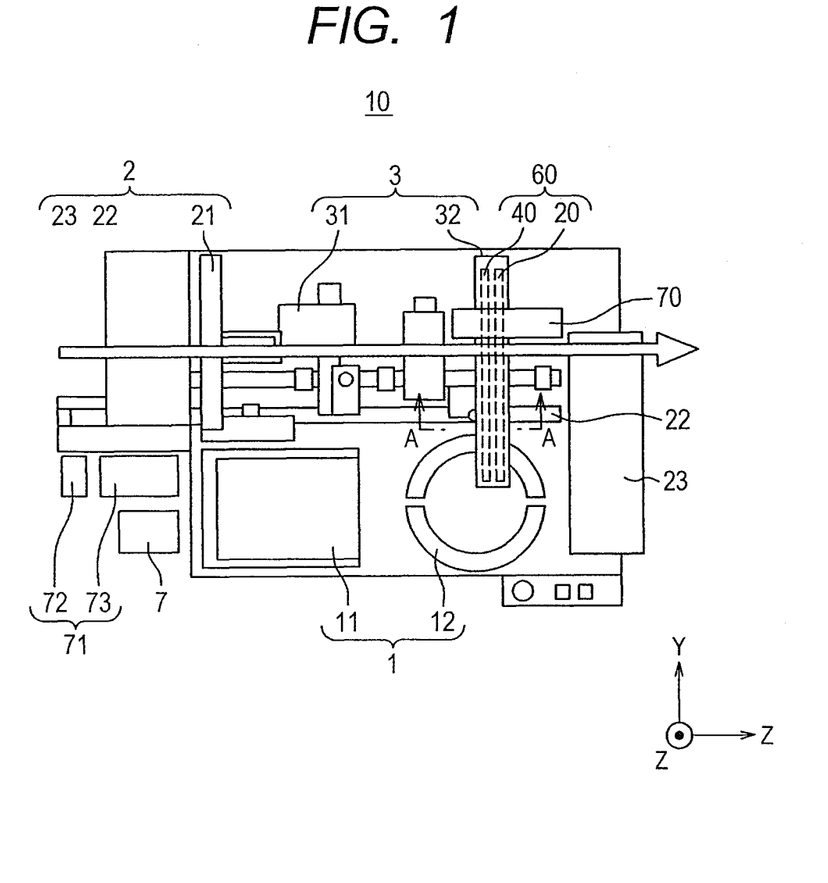
FIG. 1 is a conceptual diagram of a die bonder according to an embodiment present invention, when viewed from above.

FIG. 1 is a conceptual diagram of a die bonder 10 according to an embodiment of the present invention, when viewed from above. The die bonder generally includes a wafer supply unit 1, a workpiece supply/carrier unit 2, a die bonding unit 3, a power supply unit 71 and a control unit 7 that controls the operations of the above mentioned constitutional elements.

The wafer supply unit 1 includes a wafer cassette lifter 11 and a pick-up device 12. The wafer cassette lifter 11 includes a wafer cassette (not illustrated) filled with wafer rings and sequentially supplies the wafer rings to the pick-up device 12. The pick-up device 12 moves over a wafer ring so as to pick up a desirable die from the wafer ring.

The workpiece supply/carrier unit 2 includes a stack loader 21, a frame feeder 22 and an unloader 23, and carries a workpiece (a substrate such as a lead-frame or the like) in an arrow direction. The stack loader 21 supplies the workpiece to which a die is to be bonded to the frame feeder 22. The frame feeder 22 carries the workpiece to the unloader 23 through two processing positions on the frame feeder 22. The unloader 23 retains therein the workpiece which has been carried to it.

The die bonding unit 3 includes a pre-forming unit (a die paste application device) 31 and a bonding head unit 32. The pre-forming unit 31 applies a die adhesive onto a workpiece such as, for example, a lead-frame which has been carried to it by the frame feeder 22, using a needle. The bonding head unit 32 picks up the die from the pickup device 12, and goes upward and moves the die up to a bonding point on the frame feeder 22. Then, the bonding head unit 32 descends the die at the bonding point and bonds the die onto the workpiece to which the die adhesive is applied.

The bonding head unit 32 includes a ZY drive shaft unit 60 for ascending/descending a bonding head 35 (see FIG. 2) in a Z (height) direction and moving the head 35 in a Y direction, and an X drive shaft unit 70 for moving the ZY drive shaft unit 60 in an X direction. The ZY drive shaft unit 60 includes a Y drive shaft unit 40 for reciprocally moving the bonding head in the Y direction, that is, between a pick-up position in a wafer ring holder 12 and a bonding point and a Z drive shaft unit 20 for ascending/descending the die in order to pick it up from the wafer or to bond it to the substrate. The X drive shaft unit 70 moves the entire of the ZY drive shaft unit 60 in the X direction in which the workpiece is carried. The X drive shaft unit 70 may be either configured to convert a rotary motion of a servo motor to a linear motion, for example, by a ball screw or configured to be driven by a linear motor which will be described in explanation of a configuration of the ZY drive shaft unit 60.

The power supply unit 71 includes a main power supply 72 which is used for performing a normal mounting process, and, in some cases, an extra power supply 73 which is used for ascending/descending shaft unit fall-prevention which will be described later and is different from the main power supply such as, for example, a battery.

Figure 2:
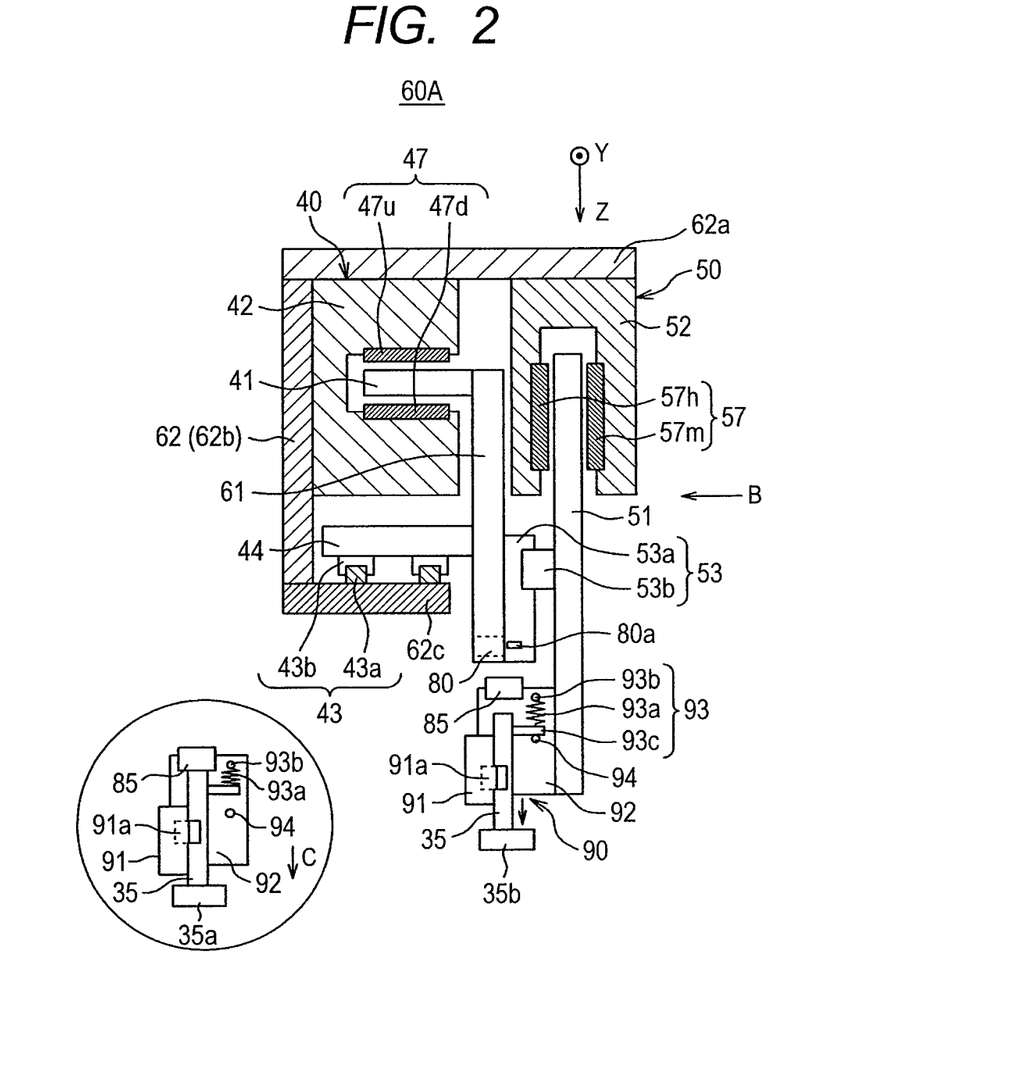
FIG. 2 is a sectional diagram of a position where a bonding head of a ZY drive shaft unit in FIG. 1 is present, taken along the A-A line in FIG. 1.
Figure 3:
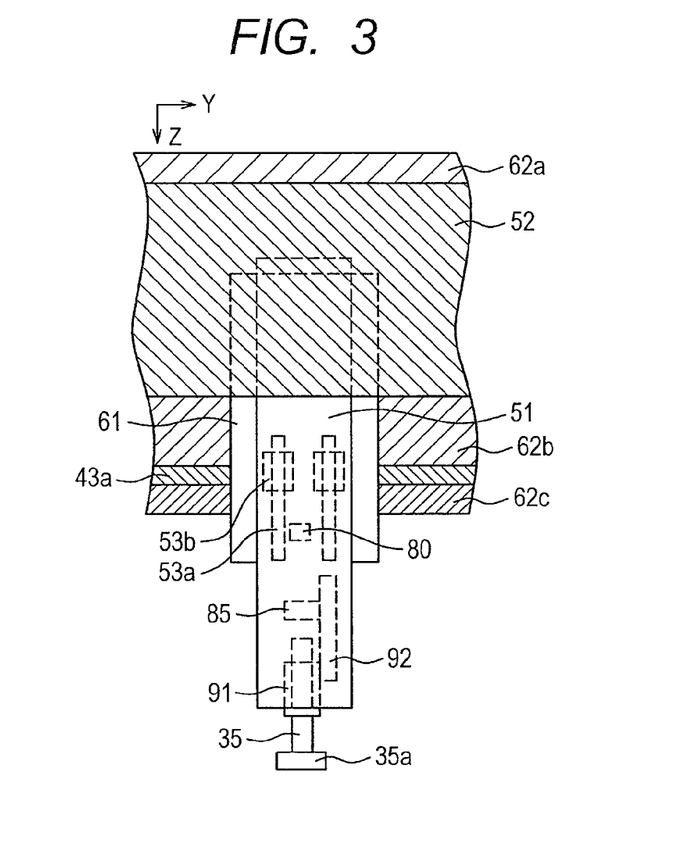
FIG. 3 is a diagram of the ZY drive shaft unit in FIG. 2, when viewed from a direction of an arrow B.

Next, embodiments of the ZY drive shaft unit 60 that features the present invention will be described with reference to the accompanying drawings. FIG. 2 and FIG. 3 are diagrams illustrating a basic configuration of a ZY drive shaft unit 60A according to a first embodiment of the present invention. FIG. 2 is a sectional diagram of a position where the bonding head 35 of the ZY drive shaft unit 60A in FIG. 1 is present, taken along the A-A line. FIG. 3 is a diagram of the ZY drive shaft unit 60A in FIG. 2, when viewed from a direction of an arrow.

The ZY drive shaft unit 60A according to the first embodiment includes the Y drive shaft unit 40, the Z drive shaft unit 20 as an ascending/descending shaft unit, a coupling part 61 for coupling a Y-axis movable part 41 of the Y drive shaft unit 40 to a Z-axis movable part 51 of the Z drive shaft unit 20, the bonding head 35 as a processing unit, and a laterally oriented L-shaped support 62 for supporting all the above mentioned elements. For ready understanding of description, a shaded part indicates a part fixed to the support 62 and a blank part indicates a part that moves integrally with the Y axis movable part 41, the Z axis movable part 51 and the coupling part 61. The support 62 includes an upper support 62a, a side support 62b and a lower support 62c.

The Y drive shaft unit 40 includes a C-shaped Y-axis stationary part 42 which includes upper and lower stationary magnet parts 47u and 47d formed by alternately arranging many N-pole and S-pole magnets or electromagnets in the Y direction, the Y-axis movable part 41 which includes at least one set of N-pole and S-pole electromagnets arranged in the above mentioned arrangement direction and is inserted into a C-shaped recessed part to move within the recessed part, the coupling part 61 for supporting the Y-axis movable part 41, and a Y-axis guide part 44 which is fixed to the coupling part 61 and includes a Y-axis linear guide 43 disposed between it and the lower support 62C. Therefore, the Y drive shaft unit 40 is configured by using a so-called linear motor which obtains propulsion force from repellent force of magnets installed on the stationary parts and the movable parts. In the present invention, the linear motor of the above mentioned type will be referred to as a magnet type linear motor. In the following, when the entire of the stationary magnet parts 47u and 47d is indicated, or positions of "u" and "d" are not specified, the stationary magnet part will be simply designated by 47.

The Y-axis stationary part 42 is disposed over almost the entire area of the Y drive shaft unit 40 indicated by broken lines in FIG. 1 such that the Y-axis movable part 41 moves within a predetermined range. The Y-axis linear guide 43 includes two linear rails 43a extending in the Y direction and a linear slider 43b which moves on the linear rails.

The Z drive shaft unit 20 includes a main Z drive shaft unit 50 for ascending/descending the bonding head 35 and exerting a high load (for example, 8 to 30 N) on a die and a low-load Z drive shaft unit 90 for supporting the load on the die and exerting a low load (0 to 8 N) on the die. The Z drive shaft unit 20 also includes an ascending/descending shaft unit fall-preventing unit 80 for preventing the bonding head from falling when the power from the main power supply 72 is lost.

The main Z drive shaft unit 50 is configured by using a magnet type linear motor which includes an inverted-U-shaped Z-axis stationary part 52 including left and right stationary magnet parts 57h and 57m (see FIG. 4 and hereinafter simply designated by 57 when the entire of the magnet parts is indicated or the positions thereof are not specified) formed by alternately arranging many N-pole and S-pole magnets or electromagnets in the arrangement direction as in the case of the Y drive shaft 40. The Z-axis stationary part 52 includes a Z-axis movable part 51 which includes at least one set of N-pole and S-pole magnets which is arranged thereon in the above arrangement direction and is inserted into an inverted-U-shaped recessed part to move in the recessed part. The main Z drive shaft unit 50 also includes a Z-axis linear guide 53 which has the same configuration as the Y-axis linear guide 43 between the Z-axis movable part 51 and the coupling part 61. The Z-axis linear guide 53 includes two linear rails 53a which are fixed to the coupling part 61 and extend in the Z direction and a linear slider 53b which is fixed to the Z-axis movable part 51 and moves on the linear rails.

The Z-axis movable part 51 is connected with the Y-axis movable part 41 via the coupling part 61 and moves also in the Y direction as the Y-axis movable part 41 moves in the Y direction. In the above mentioned case, it is desirable to ascend/descend the Z axis movable part 51 (the bonding head 35) at a predetermined position of a moving destination.

Figure 4:
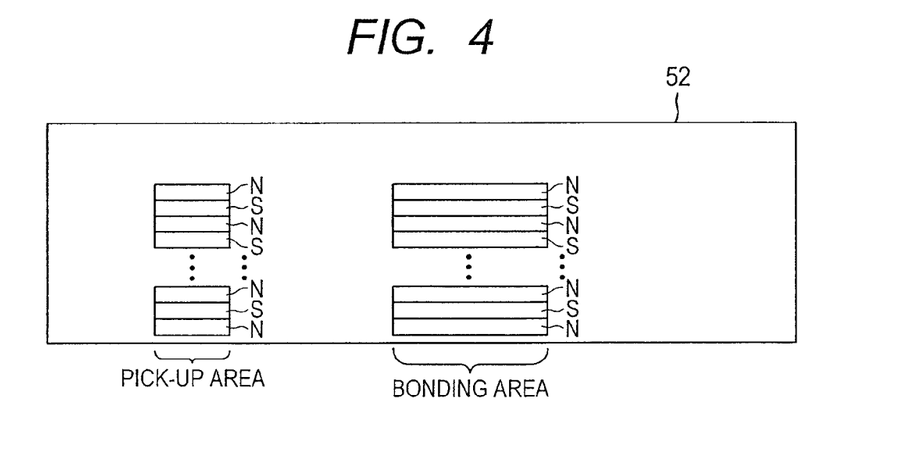
FIG. 4 is a schematic diagram illustrating examples of configurations of left and right stationary magnet parts with the aid of which a bonding head is ascended/descended at a predetermined position.

FIG. 4 is a schematic diagram illustrating examples of configurations of the left and right stationary magnet parts 57 (57h and 57m) used for ascending/descending the bonding head 35 at the predetermined position. In this embodiment, elongated N-poles and S-poles are alternately arranged at least in a bonding area and a pick-up area. Each of the elongated N-poles and S-poles may be divided into short sections. It goes without saying that elongated N-poles and S-poles may be alternately arranged over the entire area in the Y direction.

On the other hand, the low load Z drive shaft unit 90 is disposed on a leading end of the Z-axis movable part 51. The low load Z drive shaft 90 includes a stationary plate 92 which is fixed to the Z-axis movable part 51, a voice coil motor 91 which is fixed to the stationary plate and exerts a low load on the die, a spring part 93 for restricting backlash of a leading end part of the bonding head 35 and a stopper 94 for retaining the position of the bonding head 35. The voice coil motor 91 is a linear motor in which a coil through which an electric current flows in a magnetic field and a magnet which forms the magnetic field linearly move relative to each other by the Fleming's left hand rule.

The spring part 93 includes a spring support bar 93c fixed to the bonding head 35, a spring support bar 93b fixed to the stationary plate 92 and a compression spring 93a latched to the both support bars. The spring part 93 presses the bonding head 35 against the stopper 94 with the aid of a spring load (for example, about 400 g) of the compression spring 93b.

In addition, the stationary plate 92 includes a load cell 85 which is brought into contact with an upper part of the bonding head 35 to detect a load which is exerted on the die by the bonding head. It goes without saying that the load may be detected by a load detection sensor other than the load cell.

The voice coil motor 91 may operate to exert a load up to 8 N on the bonding head 35 which is pressed against the stopper 94 in the direction of the arrow C in FIG. 2. A loading amount may be defined on the basis of a current value of the voice coil motor 91.

In addition, the voice coil motor 91 may operate to ascend the bonding head 35 against the action of the compression spring 93a and bring it into contact with the load cell 85 so as to transmit a high load to the bonding head 35 as illustrated in a partially extracted view in FIG. 2.

Owing to the above mentioned configuration, the low-load Z drive shaft unit 90 of the first embodiment has four modes. A first mode is an initial state mode in which the drive shaft unit 90 is allowed to exert a maximum load on the die as described above and the drive shaft unit 90 is brought into an initial state. In the embodiment, a maximum load is 8 N. A second mode is a high load mode in which the above mentioned bonding head 35 is brought into contact with the load cell 85 to exert a high load on the die by the main Z drive shaft unit 50. In the above mentioned mode, a load which is exerted on the die by the voice coil motor 90 is zero or almost zero. A third mode is a low load mode in which the current value of the voice coil motor 91 is controlled to exert a predetermined load on the die within a range from zero to a maximum of 8 N when the die is to be bonded to a workpiece. A fourth mode is a pick-up mode in which the die is adsorbed and picked up from a wafer by a collet 35a. In the pick-up mode, the bonding head 35 is fixed by the stopper 94 and the current value of the voice coil motor 91 is adjusted so as not to exert a too high load on the die when picked-up or bonded.

In the above mentioned modes, the positions of a voice coil part 91a that it takes in the initial state mode and in the high load mode are set to the both ends of a movable range of the voice coil part 91a, by which the positions that the voice coil part 91a takes in the above two modes may be set by open loop control. It goes without saying that a position sensor may be disposed so as to feedback-control the positions of the voice coil part 91a in the above two modes.

On the other hand, when a die is to be bonded onto a workpiece by exerting a load which is higher than 8 N on the die, the low-load Z drive shaft unit 90 is set into the high load mode in advance and then torque feedback control is performed on the main Z drive shaft unit 50 on the basis of an output from the load cell 85. The mode in which torque feedback control is so performed on the main Z drive shaft unit 50 is referred to as a torque control mode. The main Z drive shaft unit 50 is subjected to position feedback control in modes other than the torque control mode, such as for example, when picking-up is performed, when it moves from a pick-up position to a bonding position and when bonding is performed in the low load mode. This mode is referred to as a position control mode.

The ascending/descending shaft unit fall-preventing unit 80 includes a pressure solenoid 81 with a push bar 81a a protruded part of which is elongated when the power is lost and the extra power supply 73 illustrated in FIG. 1.

In the ascending/descending shaft unit fall-preventing unit 80 so configured as mentioned above, when the power is lost, the control unit 7 detects that the power from the main power supply 72 has been lost and connects the pressure solenoid 81 to the extra power supply 73 while the power is being maintained by a condenser or the like. After that, the extra power supplies to the solenoid its power. As a result, the pressure solenoid 81 actuates and the push bar 81a is protruded to support the linear slider 53b, thereby preventing the bonding head 35 from falling onto a substrate P.

Various fall-preventing units other than the above may be conceived of as the ascending/descending shaft unit fall-preventing unit 80. For example, in some cases, a spring is used, that is, the spring is caused to jump out to support a part of the ascending/descending shaft unit when the power is lost.

Next, a flow of a process in the first embodiment will be described with reference to FIG. 5.

First, the main Z drive shaft unit is set into a position control mode (S1) and then the low-load Z drive shaft unit 90 is set into an initial state mode (S2). Then, the bonding head 35 is moved to a position where a die is to be picked up on a wafer by the Y drive shaft unit 40 (S3). Then, the bonding head 35 is descended down to a position just before the pick-up position by the main Z drive shaft unit 50 and then is stopped (S4). Then, the low-load Z drive shaft unit 90 is set into a pick-up mode so as not to exert a too high load on the die when picked up (S5) and the bonding head is further descended by the main Z drive shaft unit 50 and the die is picked up (S6). After picked up, the low-load Z drive shaft unit 90 is returned to the initial state mode (S7).

Next, the bonding head 35 is moved to a bonding position by the Y drive shaft unit 40 (S8). Then, the main Z drive shaft unit is position-controlled to descend the bonding head 35 down to a position just before the bonding position, for example, before a 100-nm bonding position (S9). Then, whether a low or high load is to be exerted on the die is determined (S10). When a high load mode in which a high load is exerted is selected, the process proceeds to S11, while when a low load mode in which a low load is exerted is selected, the process proceeds to S18.

In the high load mode, first, the low-load Z drive shaft unit is set into the high load mode so as to exert the high load on the die by the main Z drive shaft unit 50, namely so as to reduce the load to be exerted on the die by the low-load Z drive shaft unit 90 to almost zero (S11). Then, the main Z drive shaft unit 50 is position-controlled to install the die on the bonding position (S12). After installed, the main Z drive shaft unit 50 is set into the torque control torque mode in which a predetermined load is exerted (S13), and the die is pressed against a workpiece or a die which has already been bonded onto the workpiece for a predetermined period and the die is released from an adsorbed state in the midst of pressing (S14). The installed die is surely bonded to the workpiece with an adhesive which is applied onto the workpiece or an adhesive tape affixed to a rear surface of the die by pressing the die.

Then, the main Z drive shaft unit 50 is returned to the position control mode (S15) and the bonding head 35 is ascended up to a Y-axis movement level by the main Z drive shaft unit (S16), and the low-load Z drive shaft unit 90 is returned to the initial state mode in the midst of ascending (S17).

On the other hand, in the low load mode, first, the low-load Z drive shaft unit 90 is set into a pickup mode so as not to exert a too high load on the die when bonding (S18). Then, the main Z drive shaft unit 50 is position-controlled to install the die on the bonding position (S19). After installed, the low-load Z drive shaft unit 90 is set into a predetermined-loaded low load mode (S20), and the die is pressed against the workpiece or the die is depressed for a predetermined period by descending the bonding head 35 in the low load mode, and the die is released from the adsorbed state in the midst of pressing (S14).

Then, the low-load Z drive shaft unit is returned to the pickup mode (S21), the bonding head 35 is ascended up to a Y-axis movement level by the main Z drive shaft unit (S16), and the low-load Z drive shaft unit 90 is returned to the initial state mode in the midst of ascending (S17). As an alternative, Step S21 may be omitted.

When there still remains a die to be processed at the completion of the process performed in the high load mode or the low load mode, the flow returns to S3 and the bonding process is continued (S22).

According to the above mentioned drive shaft unit 60A of the first embodiment, it is allowed to provide die bonder and bonding method by which a load desirable for bonding ranging from a high load to a low load is obtained by connecting the main Z drive shaft unit in series with the low-load Z drive shaft unit.

In addition, according to the above mentioned drive shaft unit 60A of the first embodiment, it is allowed to provide die bonder and bonding method by which high-speed mounting is attained by using magnet type linear motors for the main Z drive shaft unit and the Y drive shaft unit.

Further, according to the above mentioned drive shaft unit 60A of the first embodiment, although the Z drive shaft unit 52 is installed over almost the entire area, since the Z-axis stationary part 52 itself which is a weighted element is not moved, a load exerted on movement in the Y direction is favorably reduced and hence speeding-up of the ascending/descending shaft unit may be attained without increasing the torque of the horizontal drive shaft unit.

Still further, according to the above mentioned drive shaft unit 60A of the first embodiment, falling of the bonding head, which includes the ascending/descending shaft unit configured by using the magnet type linear motor, may be prevented by providing the ascending/descending shaft unit fall-preventing unit 80 even when the power from the main power supply 72 is lost.

Figure 6:
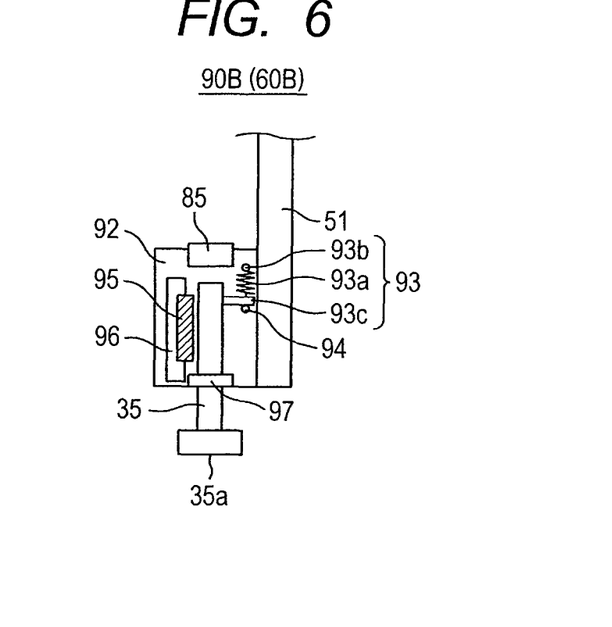
FIG. 6 is a diagram illustrating another embodiment of a low-load Z drive shaft unit in a ZY drive shaft unit according to a second embodiment.

FIG. 6 is a diagram illustrating a low-load Z drive shaft unit 90B which is another embodiment of the low-load Z drive shaft unit 90 in a ZY drive shaft unit 60B according to a second embodiment. The ZY drive shaft unit 60B is the same as the ZY drive shaft unit 60 according to the first embodiment except the configuration of the low-load Z drive shaft unit 90B. In FIG. 6, basically, the same numerals are assigned to elements which are the same as those in the first embodiment in configuration or function.

The low-load Z drive shaft unit 90B is different from the low-load Z drive shaft unit according to the first embodiment in that although the voice coil motor 91 is used as the low-load Z drive shaft unit in the first embodiment, a magnet type linear motor is used as in the case of the main Z drive shaft unit 50.

The low-load Z drive shaft unit 90B includes a Z-axis stationary part 96 for fixing a stationary magnet part 95 formed by alternately arranging many N-pole and S-pole magnets or electromagnets in the Z direction. The low-load Z drive shaft unit 90B includes at least one set of N-pole and S-pole electromagnets which is disposed on the bonding head 35 in the above arrangement direction. The bonding head 35 includes a linear guide 97 used for stable ascending and descending operations. The stationary magnet part 95 and the linear guide 97 are fixed to the stationary plate 92.

In the second embodiment, four modes of the low-load Z drive shaft unit are controlled in the same manner as those in the first embodiment.

Figure 7:
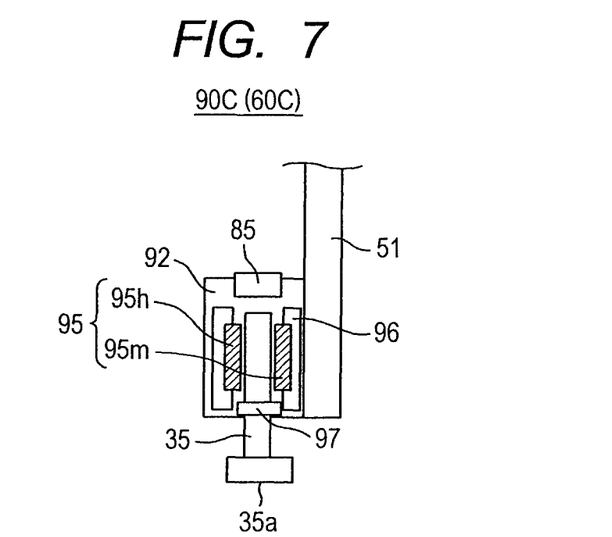
FIG. 7 is a diagram illustrating another embodiment of a low-load Z drive shaft unit in a ZY drive shaft unit according to a third embodiment.

FIG. 7 is a diagram illustrating a low-load drive shaft unit 90C according to a further embodiment of the low-load Z drive shaft unit 90 in a ZY drive shaft unit 60C according to a third embodiment. The third embodiment is different from the second embodiment in that, firstly, stationary magnet parts 95*h* and 95*m* (95) formed by alternately arranging many N-pole and S-pole magnets in the Z direction are installed on the both sides of the bonding head 35, and secondarily, the four modes of the low-load Z drive shaft unit are performed by position control and torque control of the linear motors described in explanation of the main Z drive shaft unit 50 in the first embodiment. That is, operations in the initial state mode, the high load mode and the pickup mode are performed by position control and operations in the low load mode are performed by torque control.

The ZY drive shaft unit 60C is basically the same as the ZY drive shaft unit 60B in the second embodiment in other respects.

Figure 5:
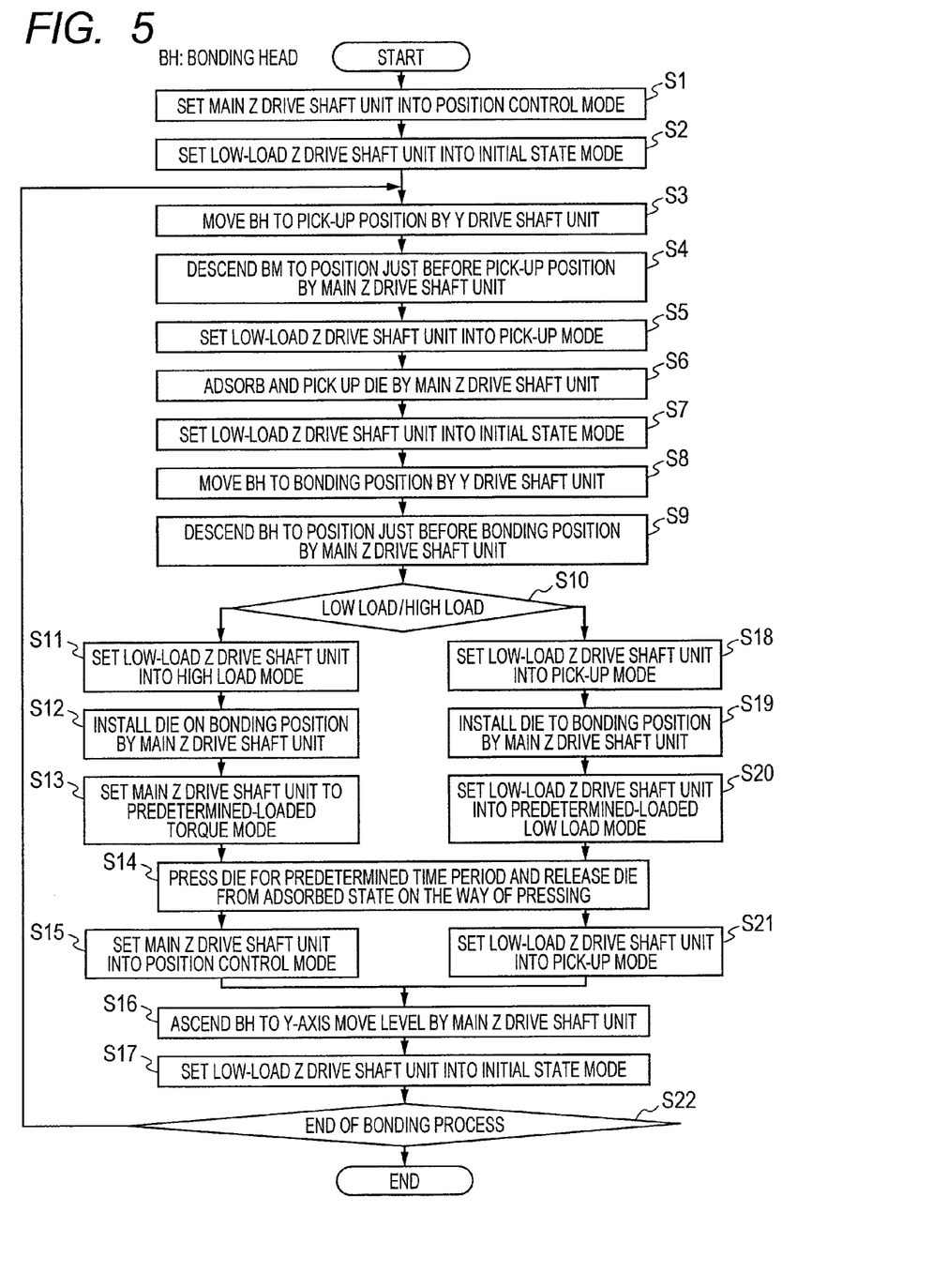
FIG. 5 is a flowchart of a bonding process in a first embodiment.

Also in the second and third embodiments, the process may be performed basically on the basis of the process flow in FIG. 5 and the same effects as those by the first embodiment may be obtained.

In the above mentioned embodiments, from the view point of attaining the first object, a driving system for converting a rotary motion of a servo motor to a linear motion, for example, by a ball screw may be used in at least one of the Y drive shaft unit and the main Z drive shaft unit. Similarly, this driving system for converting the rotary motion to the linear motion may be used in the low-load Z drive shaft unit.

Although the embodiments of the present invention have been described as mentioned above, the present invention may be altered, modified or varied in a variety of ways by a person skilled in the art and the present invention covers various altered, modified or varied examples as mentioned above without departing from the gist of the present invention.

What is claimed is:

1. A die bonder, comprising:
a die bonding head for picking up a die and bonding the die onto a workpiece;
a biaxial drive shaft unit which includes an ascending/descending drive shaft unit for ascending/descending the bonding head and a horizontal-direction drive shaft unit for moving the ascending/descending drive shaft unit in a horizontal direction perpendicular to a direction in which the bonding head is ascended/descended; and
a control unit for controlling the biaxial drive shaft unit
wherein, the ascending/descending drive shaft unit includes
a first ascending/descending drive shaft unit for ascending/descending the bonding head and being able to exert a high bonding load which is higher than a predetermined load on the die via the bonding head, and
a second ascending/descending drive shaft unit which is installed on the side of a leading end of the first ascending/descending drive shaft unit, ascends/descends in the direction in which the bonding head is ascended/descended and is able to exert a low bonding load which is lower than the predetermined load on the die via the bonding head.

2. The die bonder according to claim 1, wherein the first ascending/descending drive shaft unit and the second ascending/descending drive shaft unit are configured using linear motors.

3. The die bonder according to claim 2, wherein the linear motor of the first ascending/descending drive shaft unit is a magnet type linear motor, and the linear motor of the second ascending/descending drive shaft unit is a voice coil motor.

4. The die bonder according to claim 2, wherein the control unit torque-controls the linear motor of the first ascending/descending drive shaft unit when the bonding load is to be exerted and position-controls the linear motor of the first ascending/descending drive shaft unit in other cases.

5. The die bonder according to claim 1, wherein a load detection sensor for detecting the high bonding load is disposed on the first ascending/descending drive shaft unit with which a head of the bonding head is brought into contact.

6. The die bonder according to claim 1, wherein
the first ascending/descending drive shaft unit includes a first linear motor which includes a first movable part used for ascending/descending the bonding head along a first linear guide and a first stationary part as a drive shaft unit,
the horizontal direction drive shaft unit includes a second linear motor which includes a second movable part used for moving the bonding head in the horizontal direction and a second stationary part as a drive shaft unit, and includes
a coupling part for coupling the first movable part via the first linear guide and directly or indirectly coupling the second movable part,
a second linear guide for integrally moving the first movable part, the second movable part and the coupling part in the horizontal direction, and
a support for fixing the first fixing part and the second fixing part in the horizontal direction in parallel with each other along a predetermined length.

7. The die bonder according to claim 2, further comprising:
a main power supply for supplying power to the biaxial drive shaft unit; and
an ascending/descending shaft unit a fall-preventing unit for preventing the bonding head from falling when the power from the main power supply has been lost.

8. A bonding method, comprising:
the picking-up step of ascending/descending a bonding head by a first ascending/descending drive shaft unit and picking up a die;
the installing step of descending the bonding head to install the picked-up die on a workpiece; and
the bonding step of bonding the die to the workpiece by exerting a load on the die by the bonding head after installed, and further comprising:
the determining step of determining whether the load is higher/lower than a predetermined load,
wherein the bonding step includes the high load exerting step of, when the load is a high load which is higher than the predetermined load, exerting the high load by the first ascending/descending drive shaft unit, and the low load exerting step of, when the load is a low load which is lower than the predetermined load, exerting the low load by a second ascending/descending drive shaft unit which is serially installed under the first ascending/descending drive shaft unit.

9. The bonding method according to claim 8, wherein the picking-up step controls loads to be exerted when picking up the die and when bonding the die by the second ascending/descending drive shaft unit.

10. The bonding method according to claim 8, wherein the high load exerting step reduces the load on the second ascending/descending drive shaft unit to zero or to almost zero to switch control of the first ascending/descending drive shaft unit from position control to torque control.

11. The bonding method according to claim 8, wherein the low load exerting step position-controls the first ascending/descending drive shaft unit while the load is being exerted.

* * * * *